US006747987B1

United States Patent
Meador et al.

(10) Patent No.: US 6,747,987 B1
(45) Date of Patent: Jun. 8, 2004

(54) TRANSMIT MODULATION CIRCUIT AND METHOD OF OPERATING A TRANSMITTER

(75) Inventors: Richard B. Meador, Gilbert, AZ (US); Joshua E. Dorevitch, Chicago, IL (US); Quang C. Le, Gilbert, AZ (US); Charles H. Matsumoto, Phoenix, AZ (US); David H. Minasi, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/514,804

(22) Filed: Feb. 29, 2000

(51) Int. Cl.[7] .................................................. H04J 3/16
(52) U.S. Cl. .......................... 370/465; 455/76; 375/216
(58) Field of Search ...................... 370/465, 280–294, 370/337, 347, 345, 398, 498, 252; 375/222, 261–265, 219, 220, 340–344, 240.19, 274–281, 303–305, 302, 141, 376, 375, 216, 322, 323, 130, 134, 326, 295; 331/15–19, 25; 455/113, 112, 76–78, 550–552, 44, 119, 552.1, 67.13, 265, 182.2, 192.2; 330/127, 297; 327/2, 149, 3, 7; 332/127

(56) References Cited

U.S. PATENT DOCUMENTS

| | | | |
|---|---|---|---|
| 5,055,800 A | 10/1991 | Black et al. ................. 331/1 A |
| 5,055,802 A | 10/1991 | Hietala et al. ............... 331/16 |
| 5,070,310 A | 12/1991 | Hietala et al. ............... 331/1 A |
| 5,093,632 A | 3/1992 | Hietala et al. ............... 331/1 A |
| 5,111,162 A | 5/1992 | Hietala et al. ............... 332/127 |
| 5,166,642 A | 11/1992 | Hietala ....................... 331/1 A |
| 5,493,700 A | 2/1996 | Hietala et al. ................. 455/75 |
| 5,495,206 A | 2/1996 | Hietala ....................... 331/1 A |
| 5,834,987 A | * 11/1998 | Dent ........................... 332/127 |
| 5,890,051 A | * 3/1999 | Schlang et al. ............... 455/76 |
| 6,249,685 B1 | * 6/2001 | Sharaf et al. ............... 455/550 |
| 6,308,049 B1 | * 10/2001 | Bellaouar et al. ............. 455/76 |
| 6,456,627 B1 | * 9/2002 | Frodigh et al. ............. 370/465 |
| 6,546,044 B1 | * 4/2003 | Dent ........................... 375/216 |

OTHER PUBLICATIONS

U.S. patent application No.: 09/297,847, Fourtet et al., Filed: May 6, 1999, Motorola, Inc.
U.S. patent application No.: 09/322,533, Trichet et al., Filed: May 28, 1999, Motorola, Inc.

* cited by examiner

Primary Examiner—Chi Pham
Assistant Examiner—Prenell Jones

(57) ABSTRACT

A transmitter (100) includes a fractional N synthesizer, a baseband digital modulation stage coupled to the fractional N synthesizer in a first modulation mode, and a baseband I/Q modulation stage also coupled to the fractional N synthesizer and reusing the fractional N synthesizer in a second modulation mode. A method (300) of operating a transmitter includes transmitting a first signal from a transmitter using the fractional N synthesizer and the baseband digital modulation stage to modulate the first signal according to a first wireless protocol. The method (300) also includes transmitting a second signal from the transmitter using the baseband I/Q modulation stage and the fractional N synthesizer to modulate the second signal according to a second wireless protocol.

26 Claims, 3 Drawing Sheets

TRANSMIT MODULATION CIRCUIT AND METHOD OF OPERATING A TRANSMITTER

FIELD OF THE INVENTION

This invention relates to electronics, in general, and to transmitters having modulation circuitry and methods of operation, in particular.

BACKGROUND OF THE INVENTION

Cellular telephones operate under a wide variety of wireless protocols. Examples of such wireless protocols include a digital cellular service (DCS) wireless protocol, a global system for mobile telephones (GSM) wireless protocol, and an enhanced GSM (EGSM) wireless protocol. Other examples of such wireless protocols include a time division multiple access (IS-136 TDMA) wireless protocol and its precursor North American digital cellular (NADC) wireless protocol. Still further examples of such wireless protocols include a RAM Mobile Data wireless protocol, an integrated digitally enhanced network (IDEN) wireless protocol, and an advanced mobile phone service (AMPS) wireless protocol. Many of the wireless protocols require a unique transmission modulation mode or technique.

In the past, cellular telephones operated under a single wireless protocol, but new cellular telephones are capable of operating under two wireless protocols. An example is a cellular telephone that operates primarily on a GSM system using the GSM wireless protocol, but can roam outside the GSM system and register on a TDMA system using the IS-136 TDMA wireless protocol. However, these new cellular telephones use extremely inefficient and costly circuitry to support the diverse requirements of the multiple modulation modes for the different wireless protocols. The circuitry used in single modulation cellular telephones is often reused in multiple mode cellular telephones in a parallel manner. However, this mere aggregation of old circuitry produces a high parts count and complex programming in the new cellular telephones.

Accordingly, a need exists for a transmitter and method of operation that efficiently and cost-effectively supports the diverse requirements of the multiple modulation modes required for the different wireless protocols. Furthermore, a need exists for a transmitter and method of operation to be capable of operating under at least a majority of the wireless protocols in a single cellular telephone.

BRIEF DESCRIPTION OF THE DRAWINGS

The invention will be better understood from a reading of the following detailed description, taken in conjunction with the accompanying drawing figures in which.

Figure 1:
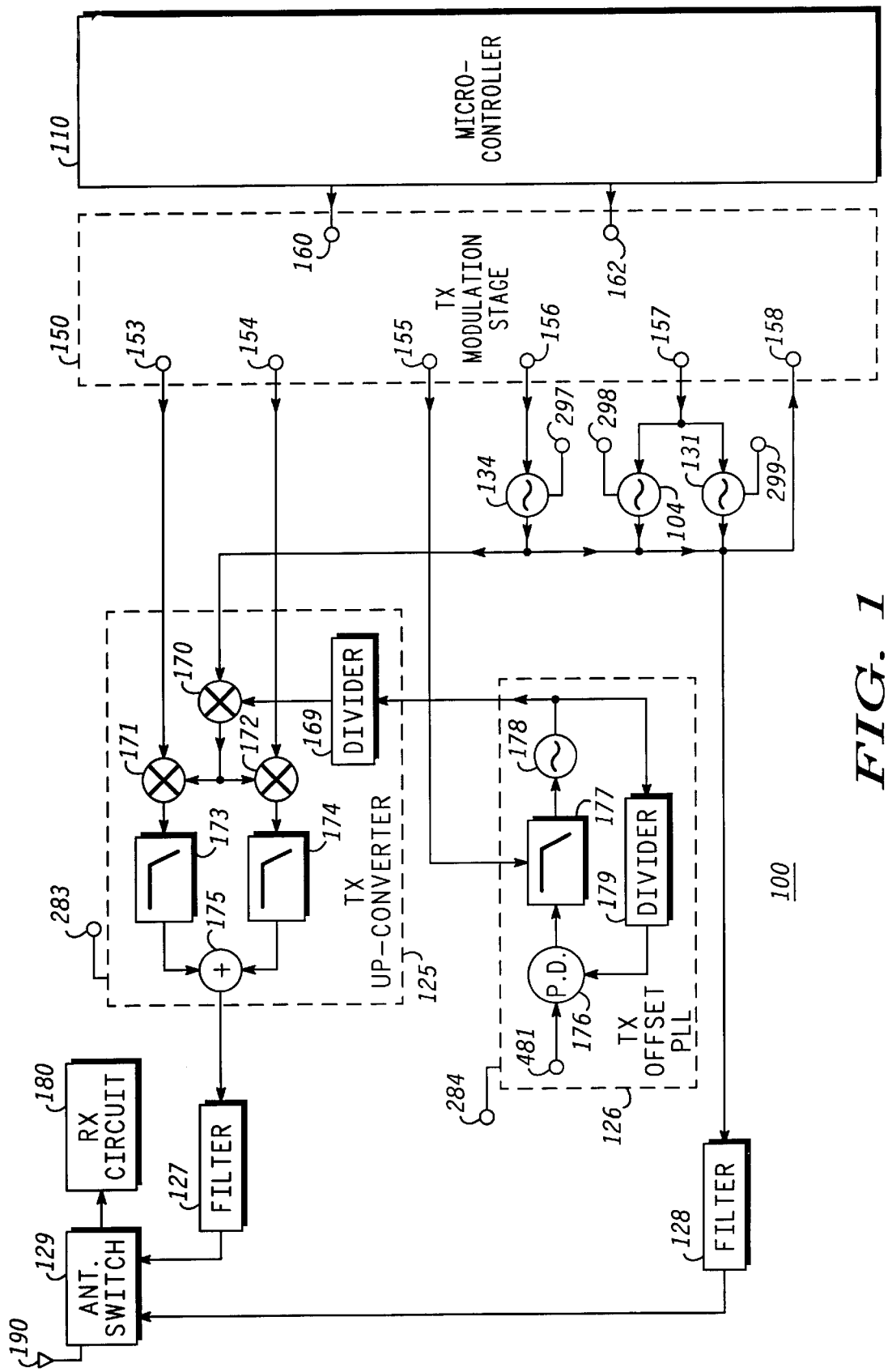
FIG. 1 illustrates a block diagram of a transmitter in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, the same reference numerals in different drawing figures denote the same elements.

DETAILED DESCRIPTION OF THE DRAWINGS

FIG. 1 illustrates a block diagram of a transmitter 100. Transmitter 100 is a single transmitter capable of operating according to all of the following wireless protocols: DCS, GSM, EGSM, IS-136 TDMA, NADC, IDEN, RAM Mobile Data, and AMPS. In the preferred embodiment, transmitter 100 is a portion of a portable or mobile cellular telephone.

Transmitter 100 comprises a transmitter architecture that supports the multiple modulation modes required for the different wireless protocols. In particular, the transmitter architecture comprises a transmit modulation circuit for all of the following types of modulation modes: a Gaussian minimum shift keying (GMSK) modulation mode for the DCS, GSM, and EGSM wireless protocols, a low-rate GMSK modulation mode for the RAM Mobile Data wireless protocol, a differential quadrature phase shift keying (DQPSK) modulation mode for the IS-136 TDMA and NADC wireless protocols, a quadrature amplitude modulation (m-16QAM) modulatior mode for the IDEN wireless protocol, and a narrow band frequency modulation (FM) modulation mode for the AMPS wireless protocol. As used herein, the term "TDMA" includes the NADC and IS-136 TDMA, and the term "EGSM" includes GSM. Accordingly, NADC and IS-136 are subsets of TDMA, and GSM is a subset of EGSM. Furthermore, the low-rate GMSK modulation is a subset of the GMSK modulation.

Transmitter 100 comprises an antenna 190 coupled to a switched antenna filter network 129 and a receiver (RX) circuit 180 coupled to switched antenna filter network 129. Switched antenna filter network 129 comprises a duplexer when the AMPS wireless protocol is used. The duplexer permits transmitter 100 to simultaneously transmit and receive radio frequency (RF) signals.

Transmitter 100 also comprises a transmit (TX) up-converter 125. TX up-converter 125 comprises a first mixer 171, a second mixer 172, an image reject mixer 170 coupled to mixers 171 and 172, a frequency divider 169 coupled to image reject mixer 170, a first low pass filter 173 coupled to first mixer 171, a second low pass filter 174 coupled to second mixer 172, and an adder 175 coupled to first low pass filter 173 and to second low pass filter 174. One skilled in the art will understand that TX up-converter 125 may include other components known in the art.

Transmitter 100 further comprises a TX offset phase lock loop (PLL) 126 coupled to TX up-converter 125. TX offset PLL 126 comprises a phase detector 176 receiving a reference frequency via a node 481, a low pass filter 177 coupled to phase detector 176, a voltage-controlled oscillator (VCO) 178 coupled to low pass filter 177 and to frequency divider 169 in TX up-converter 125, and a frequency divider 179 coupled to VCO 178 and phase detector 176. One skilled in the art will understand that TX up-converter 125 may include other components known in the art.

Transmitter 100 additionally comprises a first filtered amplifier stage 127 coupled to adder 175 of TX up-converter 125 and to switched antenna filter network 129, and transmitter 100 further comprises a second filtered amplifier stage 128 coupled to switched antenna filter network 129. Transmitter 100 also comprises a VCO 104 coupled to filtered amplifier stage 128, a VCO 131 coupled to filtered amplifier stage 128, and a VCO 134 coupled to filtered amplifier stage 128 and to image reject mixer 170 in TX up-converter 125. Transmitter 100 also comprises a microcontroller 110, which preferably comprises a microprocessor (uP) and a digital signal processor (DSP). Transmitter 100 further comprises a TX modulation stage 150 coupled to microprocessor 110 via nodes 160 and 162, to VCOs 104 and 131 via a node 157, to VCO 134 via a node 156, to mixers 171 and 172 in TX up-converter 125 via nodes 153 and 154, and to low pass filter 177 in TX offset PLL 126 via a node 155.

Figure 2:
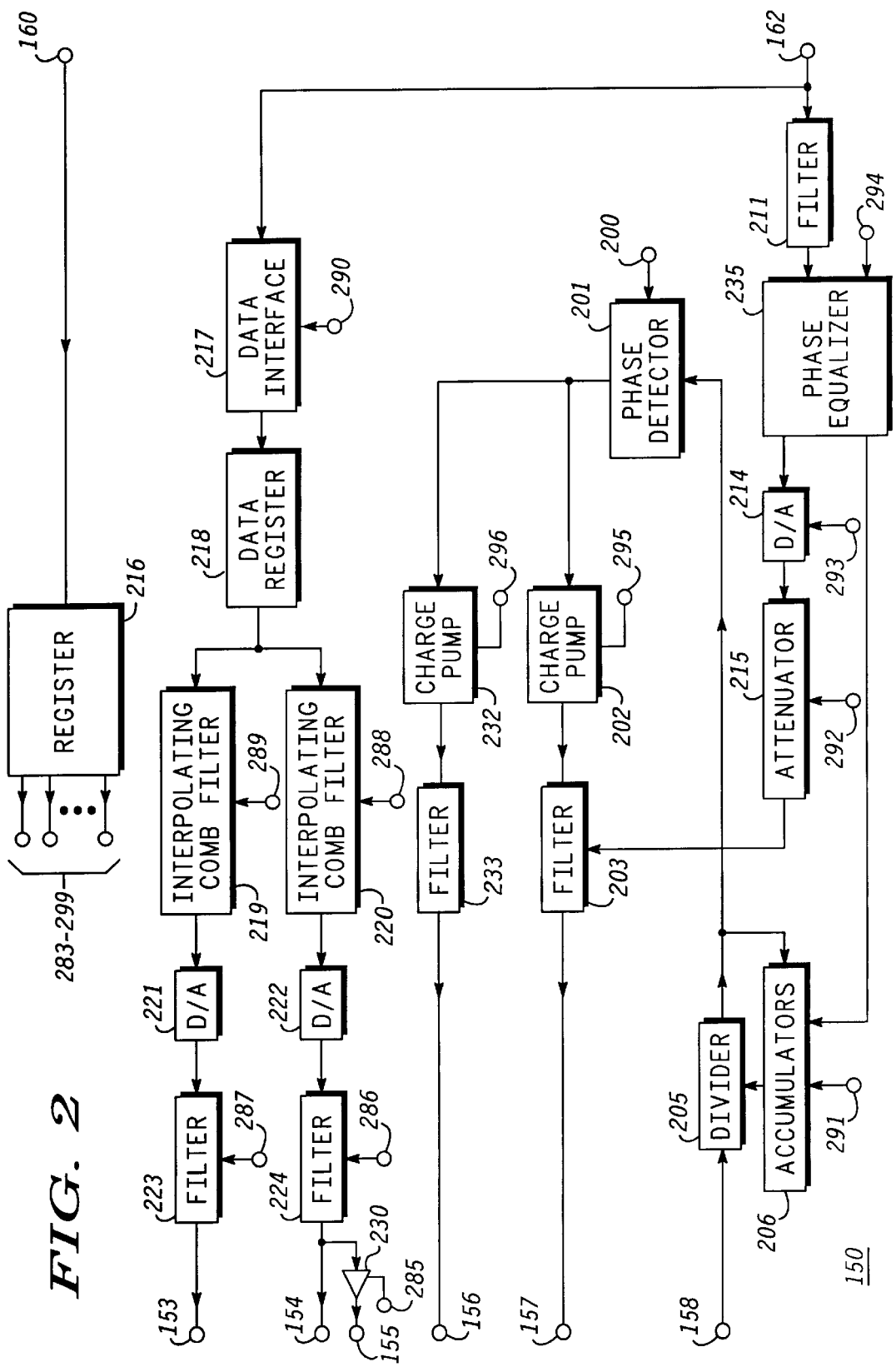
FIG. 2 illustrates a block diagram of a transmit modulation stage of the transmitter of FIG. 1 in accordance with an embodiment of the invention.

FIG. 2 illustrates a block diagram of TX modulation stage 150. In the preferred embodiment, all elements of TX modulation stage 150 illustrated in FIG. 2 are part of the transmit modulation circuit. Furthermore, all elements of TX modulation stage 150 illustrated in FIG. 2 are preferably fabricated in a single bipolar complimentary metal oxide semiconductor (BiCMOS) integrated circuit (IC) that is packaged in a ball grid array (BGA) surface mount package. FIG. 2 is described in conjunction with FIG. 1. All elements having a reference numeral between 200 and 299 are illustrated in FIG. 2, and all elements having a reference numeral between 100 and 199 are illustrated in FIG. 1. Some of the elements having reference numerals between 100 and 199 are repeated in FIG. 2 for continuity, and some of the elements having reference numerals between 200 and 299 are repeated in FIG. 1 for continuity.

TX modulation stage 150 comprises a fractional N synthesizer, a baseband digital modulation stage, and a baseband I/Q modulation stage. The fractional N synthesizer is used for the GMSK modulation for the EGSM, DCS, and RAM Mobile Data wireless protocols. The fractional N synthesizer is also used for the IDEN, TDMA, and AMPS wireless protocols.

The fractional N synthesizer is a PLL comprising a phase detector 201 receiving a reference frequency from a node 200, a wide band charge pump 202 coupled to phase detector 201, a wide band loop filter 203 coupled to wide band charge pump 202, VCO 131 (FIG. 1) coupled to wide band loop filter 203 via node 157, a frequency divider 205 coupled to VCO 131 via a node 158 and also coupled to phase detector 201, and a multi-accumulator or accumulators 206 coupled to frequency divider 205. The fractional N synthesizer also comprises a VCO 104 (FIG. 1) coupled to wide band loop filter 203 via node 157 and also coupled to frequency divider 205 via node 158. Accordingly, VCO 104 is in parallel with VCO 131. The fractional N synthesizer further comprises a narrow band charge pump 232 coupled to phase detector 201, a narrow band loop filter 233 coupled to narrow band charge pump 232, and a VCO 134 (FIG. 1) coupled to narrow band loop filter 233 via node 156 and also coupled to frequency divider 205 via node 158. Narrow band loop filter 233 has a bandwidth that is smaller than a bandwidth of wide band loop filter 203. Narrow band charge pump 232, narrow band loop filter 233, and VCO 134 are in parallel with wide band charge pump 202, wide band loop filter 203, and VCO 131 and are also in parallel with wide band charge pump 202, wide band loop filter 203, and VCO 104. One skilled in the art will understand that the fractional N synthesizer may include other components known in the art.

The three VCOs, two charge pumps, and two loop filters of the fractional N synthesizer are reconfigured for each modulation mode to provide the frequency range required and the optinum PLL bandwidth desired for the particular modulation mode being used. The specific configuration for each modulation mode is described later. In all modulation modes, frequency divider 205 is programmed with a divider ratio controlled by accumulators 206. The divided down signal of frequency divider 205 is coupled to accumulators 206. This technique of fractional N division by time averaging the divider ratio of frequency divider 205 is known to those skilled in the art.

As indicated earlier, in addition to having the fractional N synthesizer, TX modulation stage 150 also comprises the baseband digital modulation stage. This baseband digital modulation stage is used for a two-port digital modulation technique for the GMSK modulation mode of the EGSM and DCS wireless protocols. The two-port digital modulation technique applies two modulation signals at two ports of the fractional N synthesizer. In particular, the two-port digital modulation technique applies a first signal to a first port of the fractional N synthesizer located at accumulators 206 and applies a second signal to a second port of the fractional N synthesizer located at wide band loop filter 203. The technique of applying a modulating signal to two ports of a synthesizer is known by those skilled in the art to make the modulation signal independent of a loop bandwidth of the synthesizer. The baseband digital modulation stage and the fraction N synthesizer operate in a direct launch mode to transmit a direct launch transmission signal from transmitter 100.

The baseband digital modulation stage comprises a digital filter 211 coupled to microcontroller 110 (FIG. 1) via node 162, a phase equalizer 235 coupled to digital filter 211 and to accumulators 206, a digital-to-analog (D/A) converter 214 coupled to phase equalizer 235, and a modulation attenuator 215 coupled to D/A converter 214 and to wide band loop filter 203. Attenuator 215 can be resistively coupled to loop filter 203, but is preferably capacitively coupled to filter 203 using a two or three element capacitive tap. One skilled in the art will understand that the baseband digital modulation stage may include other components known in the art.

For the GMSK modulation mode, microcontroller 110 sends a digital modulating signal comprised of a 270.833 kilobit per second (kbps) serial bit data stream to digital filter 211 via node 162. Digital filter 211 applies a predetermined Gaussian filter function on the data stream received from microcontroller 110. Digital filter 211 transmits the digitally filtered data to phase equalizer 235. Phase equalizer 235 adjusts the phase of the modulation signals applied to the two ports of the fractional N synthesizer to be correctly compensated to avoid modulation distortion. Phase equalizer 235 transmits the phase-compensated digital signal to D/A converter 214. D/A converter 214 converts the digital signal into an analog signal and transmits the analog signal to modulation attenuator 215. Attenuator 215 controls the amplitude of the modulation signal applied to wide band loop filter 203. The amount of attenuation provided by attenuator 215 is programmed by a serial control register 216 in TX modulation stage 150 via a node 292. For the GMSK modulation mode for the DCS wireless protocol, the signal at the output of loop filter 203 modulates the frequency of VCO 131. For the GMSK modulation mode of the EGSM wireless protocol, the signal at the output of loop filter 203 modulates the frequency of VCO 104.

For both DCS and EGSM wireless protocols, phase equalizer 235 also transmits the phase compensated digital signal to accumulators 206. The digital signal modulates the phase count of accumulators 206, and the modulated phase count of accumulators 206 modulates the divide ratio of frequency divider 205. Therefore, modulating the divider ratio of divider 205 frequency modulates the fractional N synthesizer.

Prior to operation in the DCS and EGSM wireless protocols, transmitter 100 (FIG. 1) is configured in the following manner. Microcontroller 110 sends an instruction signal to program serial control register 216 via node 160, and serial control register 216 sends control signals to, among other components, wide band charge pump 202 and narrow band charge pump 232 via nodes 295 and 296, respectively. The control signals select or enable wide band charge pump 202 and de-select or disable narrow band charge pump 232. In the DCS and EGSM wireless protocols, the fractional N synthesizer is configured in a wide bandwidth mode to improve lock time and to pass the wide band GMSK modulation signal.

Also in response to the instruction signal from microcontroller 110, serial control register 216 sends control signals to attenuator 215, D/A converter 214, and phase equalizer 235 via nodes 292, 293, and 294, respectively. These control signals select or enable attenuator 215, D/A converter 214, and phase equalizer 235 to operate in accordance with the DCS and EGSM wireless protocols.

Further in response to the instruction signal from microcontroller 110, serial control register 216 sends control signals to VCOs 134, 104, and 131 via nodes 297, 298, and 299, respectively. For the DCS wireless protocol, the control signals de-select or disable VCOs 104 and 134, but select or enable VCO 131 to operate at a frequency of approximately 1,710 to 1,785 MegaHertz (MHz). For the EGSM wireless protocol, the control signals de-select or disable VCOs 131 and 134, but select or enable VCO 104 to operate at a frequency of approximately 880 to 915 MHz. Similarly, for the EGSM wireless protocol, the control signals de-select or disable VCOs 131 and 134, but select or enable VCO 104 to operate at a frequency of approximately 890 to 915 MHz.

For the DCS wireless protocol, VCO 131 transmits a GMSK modulated signal to filtered amplifier stage 128. The GMSK modulated signal is a direct launch transmission signal. Filtered amplifier stage 128 transmits the signal to switched antenna filter network 129, and switched antenna filter network 129 transmits the signal to antenna 190. Antenna 190 preferably transmits the direct launch transmission signal from VCO 131 out of transmitter 100 over a frequency range of approximately 1,710 to 1,785 MHz on 200 KiloHertz (KHz) channel spacings.

For the EGSM wireless protocol, VCO 104 transmits a GMSK modulated signal to filtered amplifier stage 128. Again, the GMSK modulated signal is a direct launch transmission signal. Filtered amplifier stage 128 transmits the signal to switched antenna filter network 129, and switched antenna filter network 129 transmits the signal to antenna 190. Antenna 190 preferably transmits the direct launch transmission signal from VCO 104 out of transmitter 100 over a frequency range of approximately 880 to 915 MHz on 200 KHz channel spacings. For the GSM wireless protocol, antenna 190 preferably transmits the direct launch transmission signal from VCO 104 out of transmitter 100 over a frequency range of approximately 890 to 915 MHz on 200 KHz channel spacings As indicated earlier, the fractional N synthesizer is also used for the low rate GMSK modulation for the RAM Mobile Data wireless protocol. In this embodiment, serial control register 216 disables or de-selects the digital modulation stage via nodes 292, 293, and 294. Accordingly, attenuator 215, D/A converter 214, phase equalizer 235, and digital filter 211 are not used for the RAM Mobile Data wireless protocol. Microcontroller 110 transmits serial data samples representing a low-rate GMSK modulating signal to serial control register 216 via node 160. For the RAM Mobile Data wireless protocol, microcontroller 110 uses digital filtering algorithms to perform the Gaussian filtering required for the low rate GMSK modulation. These digital filtering algorithms are known in the art. Serial control register 216 converts the serial data samples to parallel data samples and transmits the data samples to accumulators 206 via a node 291. The parallel data samples modulate the phase count of accumulators 206, and the modulated phase count of accumulators 206 modulates the divide ratio of frequency divider 205. Thus, modulating divider 205 frequency modulates the fractional N synthesizer. Typical data rates for the RAM Mobile Data wireless protocol may vary from approximately 2.4 kbps to 19.2 kbps. For example, for a 4 kbps data rate, microcontroller 110 digitally filters the binary data and outputs the filtered samples at 24 kbps to serial control register 216.

Prior to operation in the RAM Mobile Data wireless protocol, the fractional N synthesizer is reconfigured in the following manner. Microcontroller 110 sends an instruction signal to program register 216 via node 160, and serial control register 216 sends control signals to VCOs 134, 104, and 131 via node 297, 298, and 299, respectively. The control signals select or enable VCO 134 and de-select or disable VCOs 104 and 131. In response to the instruction signal from microcontroller 110, serial control register 216 also sends control signals to wide band charge pump 202 and narrow band charge pump 232 via nodes 295 and 296, respectively. The control signals select or enable narrow band charge pump 232 and de-select or disable wide band charge pump 202.

VCO 134 transmits a GMSK modulated signal to filtered amplifier stage 128. The GMSK modulated signal is a direct launch transmission signal. Filtered amplifier stage 128 transmits the signal to switched antenna filter network 129, and switched antenna filter network 129 transmits the signal to antenna 190. Antenna 190 preferably transmits the direct launch transmission signal from VCO 134 out of transmitter 100 over a frequency range of approximately 890 to 902 MHz on 12.5 KHz channel spacings.

Microcontroller 110 performs the GMSK filtering because the RAM Mobile Data wireless protocol uses data rates less than 20 kbps instead of the faster data rate of 270.833 kbps for the EGSM and DCS wireless protocols. While operating in the EGSM, DCS, and RAM Mobile Data modulation modes, serial control register 216 transmits control signals to offset PLL 126 and TX up-converter 125 via nodes 284 and 283, respectively, to de-select or disable offset PLL 126 and TX up-converter 125, respectively. Accordingly, the EGSM, DCS, and RAM Mobile Data modulation modes operate in a direct launch mode and not an offset launch mode.

As indicated earlier, in addition to having a fractional N synthesizer and a baseband digital modulation stage, TX modulation stage 150 further comprises a baseband I/Q modulation stage. This baseband I/Q modulation stage is used for the m-16QAM modulation for the IDEN wireless protocol, the DQPSK modulation for the TDMA wireless protocol, and the narrow band FM modulation for the AMPS wireless protocol. The fractional N synthesizer is used with the baseband I/Q modulation stage to implement the IDEN, TDMA, and AMPS wireless protocols, but the baseband digital modulation stage is not used for the IDEN, TDMA, and AMPS wireless protocols. The baseband I/Q modulation stage and the fraction N synthesizer operate in an offset launch mode to transmit an offset launch transmission signal from transmitter 100. The offset launch mode is different from the direct launch mode described earlier.

The baseband I/Q modulation stage comprises a data interface 217 coupled to microcontroller 110 (FIG. 1) via node 162, a data register 218 coupled to data interface 217, a first interpolating comb filter 219 coupled to data register 218, a second interpolating comb filter 220 coupled to data register 218, a first D/A converter 221 coupled to first interpolating comb filter 219, a second D/A converter 222 coupled to second interpolating comb filter 220, a first filter 223 coupled to first D/A converter 221 and to node 153, a second filter 224 coupled to second D/A converter 222 and to node 154, and a buffer 230 coupled to second filter 224 and to node 155. Interpolating comb filter 219, D/A converter 221, and filter 223 represent an I channel of the baseband I/Q modulation stage, and interpolating comb filter 220, D/A converter 222, and filter 224 form a Q channel of the baseband I/Q modulation stage. In the preferred embodiment, D/A converters 221 and 222 are 8-bit D/A converters, and filters 223 and 224 are low pass filters. The baseband I/Q modulation stage also comprises TX up-converter 125 (FIG. 1) coupled to nodes 153 and 154 and offset PLL 126 (FIG. 1) coupled to node 155. Accordingly, the IDEN, TDMA, and AMPS wireless protocols use TX up-converter 125 (FIG. 1) and offset PLL 126 (FIG. 1) and operate in an offset launch mode. One skilled in the art will understand that the baseband I/Q modulation stage may include other components known in the art.

During the m-16QAM modulation for the IDEN wireless protocol, microcontroller 110 encodes data samples into a complex m-16QAM baseband signal. The data samples that represent voice, data, error correction, and control signals. Microcontroller 110 maps the complex signal into in-phase (I) and quadrature (Q) data components. Next, microcontroller 110 outputs the I and Q data components as a serial data stream to data interface 217 via node 162. Data interface 217 converts the serial data stream into parallel data and transmits the parallel data to data register 218. The data register 218 formats and sends the data as I and Q data samples to interpolating comb filters 219 and 220, respectively. Interpolating comb filters 219 and 220 linearly interpolate the data samples and transmit the data samples to D/A converters 221 and 222. D/A converters 221 and 222 convert the data samples into analog I and Q signals and transmit the analog signals to filters 223 and 224. Filters 223 and 224 filter the analog signals in the baseband I and Q channels to attenuate undesired out-of-band noise and spurious components. Filters 223 and 224 transmit the filtered analog I and Q signals to nodes 153 and 154.

The I and Q channels transmit the filtered analog I and Q signals to TX up-converter 125, and TX up-converter 125 up-converts the filtered analog I and Q signals to a complex modulated RF carrier signal. In particular, the I and Q channels transmit the analog I and Q signals from nodes 153 and 154, respectively, to mixers 171 and 172, respectively, in TX up-converter 125. Buffer 230 (FIG. 2) is not used in this embodiment of the baseband I/Q modulation stage. Offset PLL 126 operates at a fixed output frequency of approximately 315 MHz and transmits an offset PLL signal to divider 169 in TX up-converter 125. Divider 169 divides the signal and transmits the signal to image reject mixer 170 in TX up-converter 125. Image reject mixer 170 mixes the offset PLL signal from offset PLL 126 with an output signal from VCO 134 in the fractional N synthesizer. Mixer 170 transmits the mixed signal to mixers 171 and 172 to be mixed with the analog I and Q signals. Mixers 171 and 172 transmit output signals to filters 173 and 174 in TX up-converter 125, and filters 173 and 174 transmit output signals to adder 175 in TX up-converter 125. Adder 175 transmits a summed signal to filtered amplifier stage 127. The summed signal is an offset launch transmission signal, which is different from the direct launch transmission signal described earlier. Filtered amplifier stage 127 transmits the signal through switched antenna filter network 129, and switched antenna filter network 129 transmits the signal to antenna 190. Antenna 190 preferably transmits the offset launch transmission signal from TX up-converter out of transmitter 100 over a frequency range of approximately 806 to 825 MHz.

Prior to operation in the m-16QAM modulation mode for the IDEN wireless protocol, microcontroller 110 sends a signal to register 216 via node 160, and register 216 sends control signals to various components within the I and Q channels via nodes 285, 286, 287, 288, 289, and 290 to operate the I and Q channels in the m-16QAM modulation mode. Register 216 also sends a control signal to TX offset PLL 126 and TX up-converter 125 via nodes 284 and 283 to enable offset PLL 126 and TX up-converter 125.

Register 216 additionally sends control signals to VCOs 104 and 131 and wide band charge pump 202 via nodes 298, 299, and 295 to de-select or disable VCOs 104 and 131 and wide band charge pump 202. Register 216 further sends control signals to VCO 134 and narrow band charge pump 232 via nodes 297 and 296 to enable or operate VCO 134 and narrow band charge pump 232 in the m-16QAM modulation mode. VCO 134 operates over a frequency range of approximately 963 to 982 MHz. In the m-16QAM modulation mode, the fractional N synthesizer operates with a narrow loop bandwidth to reduce undesired out of band noise and spurious components.

In a second embodiment of the baseband I/Q modulation stage, the baseband I/Q modulation stage provides DQPSK modulation for the TDMA wireless protocol. In the DQPSK modulation mode, transmitter 100 operates in a manner similar to that described earlier for m-16QAM modulation for the IDEN wireless protocol. However, in DQPSK modulation, microcontroller 110 does not encode and modulate the data samples with m-16QAM modulation. Instead, microcontroller 110 uses a raised cosine pulse-shaped filter to filter the data samples into a complex waveform. The data samples represent encoded voice, user data, error correction, and control signals. Microcontroller 110 also encodes and converts the filtered data samples to in-phase (I) and quadrature (Q) data components. Register 216 sends control signals to various components within the I and Q channels via nodes 285, 286, 287, 288, 289, and 290 to operate the I and Q channels in a DQPSK modulation mode.

Furthermore, in the DQPSK modulation mode, the fractional N synthesizer operates with a narrow loop bandwidth to reduce undesired out of band noise and spurious components, and VCO 134 preferably oscillates at approximately 981 to 1,006 MHz. TX offset PLL 126 operates at a fixed output frequency of approximately 315 MHz. Mixer 170 mixes the output of TX offset PLL 126 with the output signal of VCO 134. The output frequency of TX up-converter 125 covers the transmit range of approximately 824 to 849 MHz for the TDMA wireless protocol.

In a third embodiment of the baseband I/Q modulation stage, the baseband I/Q modulation stage provides GMSK modulation for the EGSM and DCS wireless protocols. However, one skilled in the art will understand that the earlier approaches using the baseband digital modulation stage for the EGSM and DCS wireless protocols have numerous advantages over using the baseband I/Q modulation stage for the EGSM and DCS wireless protocols.

In a fourth embodiment of the baseband I/Q modulation stage, the baseband I/Q modulation stage provides narrow band FM modulation for the AMPS wireless protocol. During the narrow band FM modulation, transmitter 100 operates in a manner similar to that described earlier for m-16QAM modulation. However, in the narrow band FM modulation mode, microcontroller 110 does not encode and modulate the data samples with m-16QAM modulation. Instead, microcontroller 110 filters, compands, limits, and converts the data samples to in-phase (I) and quadrature (Q) samples. The data samples represent voice, user data, and control signals. Microcontroller 110 converts the I and Q samples into serial data and transmits the serial data to data interface 217. Furthermore, in this fourth embodiment, register 216 sends control signals to various components within the I and Q channels via nodes 285, 286, 287, 288, 289, and 290 to operate the I and Q channels in a narrow band FM modulation mode. The fractional N synthesizer operates with the narrow loop bandwidth, and VCO 134 preferably oscillates at approximately 981 to 1,006 MHz. TX offset PLL 126 operates at a fixed output frequency of approximately 315 MHz, and mixer 170 mixes the output of TX offset PLL 126 with the output signal of VCO 134. The output frequency of TX up-converter 125 covers the transmit range of approximately 824 to 849 MHz for the AMPS wireless protocol.

In a fifth embodiment of the baseband I/Q modulation stage, the baseband I/Q modulation stage provides narrow band FM modulation for the AMPS wireless protocol in a different manner. The narrow band FM modulation in this fifth embodiment is performed by using direct FM modulation with an analog signal applied to TX offset PLL 126.

Microcontroller 110 processes, filters, compands, and limits data samples that represent voice, user data, and control signals. Microcontroller 110 outputs the unmodulated data samples as serial data to the data interface 217 of the baseband I/Q modulation stage. The baseband I/Q modulation stage decodes, interpolates, and converts the data stream to an analog modulating signal in the Q channel path. Again, the Q channel is comprised of interpolator comb filter 220, D/A converter 222, and filter 224. The I channel of the baseband I/Q modulation stage is not used. At the output of the Q channel, filter 224 transmits the analog signal to buffer 230.

Buffer 230 transmits the analog signal to low pass filter 177 in offset PLL 126 via node 155 to FM modulate the frequency of TX offset PLL 126. TX offset PLL 126 operates at a frequency of approximately 315 MHz. VCO 178 of offset PLL 126 transmits an FM modulated output signal to divider 169 of TX up-converter 125. Divider 169 divides the signal by two and transmits the signal to image reject mixer 170. Image reject mixer 170 mixes the offset PLL signal from offset PLL 126 with the output signal from VCO 134. In this embodiment, VCO 134 preferably oscillates at a frequency of approximately 981 to 1,006 MHz. Image reject mixer 170 transmits the mixed signal to mixer 172. Mixer 172 is configured as a gain stage and sends the signal to low pass filter 174, and filter 174 sends the signal to adder 175. In this fifth embodiment, mixer 171 and filter 173 of TX up-converter 125 are not used. Therefore, adder 175 does not receive an input from low pass filter 173. Also in this embodiment, mixer 172 does not receive an input from node 154 or from filter 224. The output frequency of up-converter 125 covers the transmit frequency range of approximately 824 to 849 MHz for the AMPS wireless protocol. Adder 175 sends the summed signal to filtered amplifier stage 127. The summed signal is an offset launch transmission signal, which is different from the direct launch transmission signal described earlier. Filtered amplifier stage 127 transmits the signal to switched antenna filter network 129, and switched antenna filter network 129 transmits the signal to antenna 190. Antenna 190 transmits the offset launch transmission signal from TX up-converter 125 out of transmitter 100.

Prior to operating in this fifth embodiment, microcontroller 110 sends an instruction signal to register 216 via node 160, and serial control register 216 sends control signals to various components within the I and Q channels via nodes 285, 286, 287, 288, 289, and 290 to operate the I and Q channels in this different embodiment of the narrow band FM modulation mode. Serial control register 216 also sends control signals to VCOs 104 and 131 and wide band charge pump 202 via nodes 298, 299, and 295, respectively, to de-select VCOs 104 and 131 and wide band charge pump 202, respectively. Serial control register 216 further sends control signals to narrow band charge pump 232 and VCO 134 via to nodes 296 and 297 to enable narrow band charge pump 232 and VCO 134. Register 216 additionally sends control signals to TX offset PLL 126 and TX up-converter 125 via nodes 284 and 283, respectively, to select, enable, or operate offset PLL 126 and TX up-converter 125, respectively.

Figure 3:
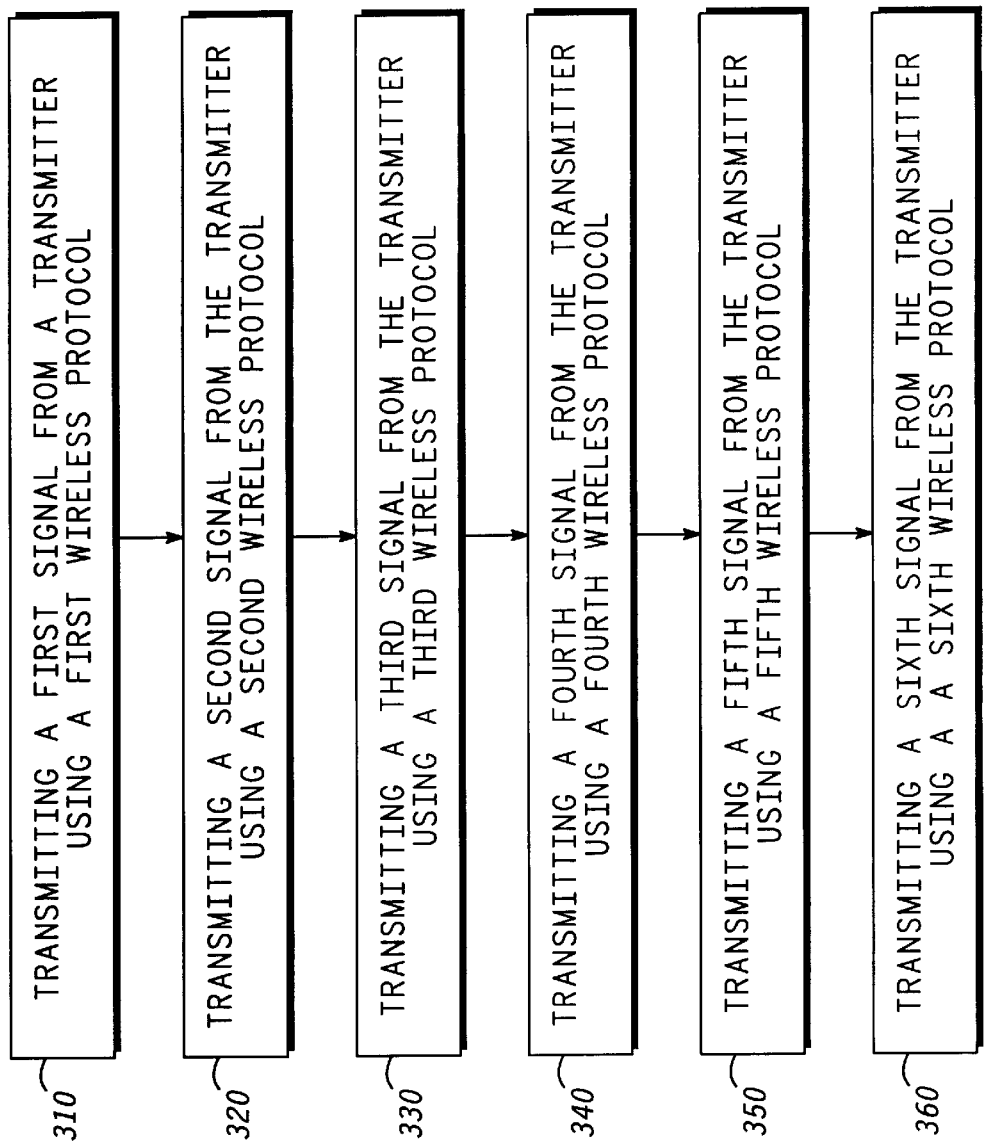
FIG. 3 illustrates a flow chart for a method of operating the transmitter of FIG. 1 in accordance with an embodiment of the invention.

FIG. 3 illustrates a flow chart of a method 300 of operating transmitter 100 (FIG. 1). At a step 310 of method 300, a transmitter uses a first wireless protocol to transmit a first RF signal. In the preferred embodiment, a fractional N synthesizer and a baseband digital modulation stage in the transmitter are used to modulate the first signal according to the first wireless protocol. At a step 320, the transmitter uses a second wireless protocol to transmit a second RF signal. In the preferred embodiment, a baseband I/Q modulation stage and the fractional N synthesizer in the transmitter are used to modulate the second signal according to the second wireless protocol.

At an optional step 330, the transmitter uses a third wireless protocol to transmit a third RF signal. In the preferred embodiment, the fractional N synthesizer and the baseband digital modulation stage in the transmitter are used to modulate the third signal according to the third wireless protocol. At an optional step 340 of method 300, the transmitter uses a fourth wireless protocol to transmit a fourth RF signal. In the preferred embodiment, the baseband I/Q modulation stage and the fractional N synthesizer in the transmitter are used to modulate the fourth signal according to the fourth wireless protocol.

At an optional step 350 of method 300, the transmitter uses a fifth wireless protocol to transmit a fifth RF signal, and at another optional step 360 of method 300, the transmitter uses a sixth wireless protocol to transmit a sixth RF signal. Each of the first, second, third, fourth, fifth, and sixth signals can be different from each other, and the different signals can be modulated differently and can be transmitted at different frequencies. As an example, each of the first, second, third, fourth, fifth, and sixth signals can be selected from a group of wireless protocols comprising EGSM, DCS, RAM Mobile Data, TDMA, IDEN, and AMPS wireless protocols.

Therefore, an improved transmitter and method of operation is provided to overcome the disadvantages of the prior art. The transmitter is highly integrated so that the transmitter and method of operation efficiently and cost-effectively supports the multiple modulation modes required for the different wireless protocols. Furthermore, the transmitter and method of operation is capable of operating under at least a majority of the wireless protocols.

Although the invention has been described with reference to specific embodiments, it will be understood by those skilled in the art that various changes may be made without departing from the spirit or scope of the invention. For instance, the numerous details set forth herein such as, for example, the specific oscillating frequencies of the VCOs in the different modulation modes are provided to facilitate the understanding of the invention and are not provided to limit the scope of the invention. Furthermore, instead of using a single IC capable of operating under all of the major wireless protocols, different modules capable of operating under different wireless protocols can be separately attached to a cellular telephone. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A transmit modulation circuit comprising:
   a fractional N synthesizer;
   a baseband digital modulation stage coupled to the fractional N synthesizer, the fractional N synthesizer operates with the baseband digital modulation stage in a first transmission mode, the first transmission mode being a direct launch mode; and
   a baseband I/Q modulation stage coupled to the fractional N synthesizer, the fractional N synthesizer operates with the baseband I/Q modulation stage in a second transmission mode, the second transmission mode being an offset launch mode.

2. The transmit modulation circuit of claim 1 wherein:
   the fractional N synthesizer comprises:
      a phase detector;
      a first charge pump coupled to the phase detector;
      a first filter coupled to the first charge pump;
      a first VCO coupled to the first filter;
      a divider coupled to the first VCO and the phase detector;
      an accumulator coupled to the divider;
      a second VCO coupled to the first filter and the divider;
      a second charge pump coupled to the phase detector;
      a second filter coupled to the second charge pump; and
      a third VCO coupled to the second filter and the divider.

3. The transmit modulation circuit of claim 2 wherein:
   the first filter has a first bandwidth;
   the second filter has a second bandwidth; and
   the second bandwidth is smaller than the first bandwidth.

4. A transmit modulation circuit comprising:
   a fractional N synthesizer;
   a baseband digital modulation stage coupled to the fractional N synthesizer;
   a baseband I/Q modulation stage coupled to the fractional N synthesizer;
   the fractional N synthesizer and the baseband digital modulation stage implement a GMSK modulation mode; and
   the fractional N synthesizer and the baseband I/Q modulation stage implement a modulation mode selected from a group consisting of a m-16QAM modulation mode, a DQPSK modulation mode, and a narrow band frequency modulation mode.

5. The transmit modulation circuit of claim 4 wherein:
   the fractional N synthesizer implements an additional GMSK modulation mode; and
   the additional GMSK modulation mode operates at a slower data rate than the GMSK modulation mode.

6. The transmit modulation circuit of claim 5 wherein:
   the additional GMSK modulation mode is for a RAM Mobile Data wireless protocol.

7. The transmit modulation circuit of claim 4 wherein:
   the GMSK modulation mode comprises a two-port digital GMSK modulation mode for a first wireless protocol selected from the group consisting of DCS, GSM, and EGSM wireless protocols;
   the m-16QAM modulation mode is for an IDEN wireless protocol;
   the DQPSK modulation mode is for a second wireless protocol selected from the group consisting of IS-136 TDMA and NADC wireless protocols; and
   the narrow band frequency modulation mode is for an AMPS wireless protocol.

8. A transmit modulation circuit comprising:
   a fractional N synthesizer;
   a baseband digital modulation stage coupled to the fractional N synthesizer,
   the baseband digital modulation stage comprising:
      a filter;
      a phase equalizer coupled to the filter;
      a digital-to-analog converter coupled to the phase equalizer; and
      an attenuator coupled to the digital-to-analog converter and to the filter; and
   a baseband I/Q modulation stage coupled to the fractional N synthesizer.

9. A transmit modulation circuit comprising:
   a fractional N synthesizer;
   a baseband digital modulation stage coupled to the fractional N synthesizer; and
   a baseband I/Q modulation stage coupled to the fractional N synthesizer,
   the baseband I/Q modulation stage comprising:
      a data interface;
      a data register coupled to the data interface;
      a first filter coupled to the data register;
      a second filter coupled to the data register;
      a first digital-to-analog converter coupled to the first filter;
      a second digital-to-analog converter coupled to the second filter;
      a third filter coupled to the first digital-to-analog converter; and
      a fourth filter coupled to the second digital-to-analog converter.

10. The transmit modulation circuit of claim 8 wherein:
    the baseband I/Q modulation stage further comprises:
       a buffer coupled to the fourth filter;
       a TX up-converter coupled to the first and second filters; and
       an TX offset PLL coupled to the buffer and the TX up-converter.

11. A portable transmitter comprising:
    a fractional N synthesizer;
    a baseband digital modulation stage coupled to the fractional N synthesizer;
    a baseband I/Q modulation stage coupled to the fractional N synthesizer;
    a first filtered amplifier stage coupled to the fractional N synthesizer;
    a second filtered amplifier stage coupled to the baseband I/Q modulation stage;
    a switched antenna filter network coupled to the first and second filtered amplifier stages; and
    a microcontroller coupled to the baseband digital modulation stage and the baseband I/Q modulation stage, wherein:
the fractional N synthesizer operates with the baseband digital modulation stage in a first transmission mode; and
the fractional N synthesizer operates with the baseband I/Q modulation stage in a second transmission mode different from the first transmission mode.

12. The portable transmitter of claim 11 wherein:
the first transmission mode is a direct launch mode; and
the second transmission mode is an offset launch mode.

13. The portable transmitter of claim 11 wherein:
the fractional N synthesizer and the baseband digital modulation stage are used for a two-port digital GMSK modulation mode for a first wireless protocol selected from a group consisting of DCS, GSM, and EGSM wireless protocols;
the fractional N synthesizer and the baseband I/Q modulation stage are used for a modulation mode selected from the group consisting of a m-16QAM modulation mode, a DQPSK modulation mode, and a narrow band frequency modulation mode;
the m-16QAM modulation mode is for an IDEN wireless protocol;
the DQPSK modulation mode is for a second wireless protocol selected from the group consisting of IS-136 TDMA and NADC wireless protocols;
the narrow band frequency modulation mode is for an AMPS wireless protocol; and
the fractional N synthesizer is used for an additional GMSK modulation mode for a RAM Mobile Data wireless protocol.

14. The portable transmitter of claim 11 wherein:
the fractional N synthesizer comprises:
  a phase detector;
  a first charge pump coupled to the phase detector;
  a first loop filter coupled to the first charge pump;
  a first VCO coupled to the first loop filter;
  a frequency divider coupled to the first VCO and the phase detector;
  an accumulator coupled to the frequency divider;
  a second VCO coupled to the first loop filter and the frequency divider;
  a second charge pump coupled to the phase detector;
  a second loop filter coupled to the second charge pump; and
  a third VCO coupled to the second loop filter and the frequency divider;
the second VCO is in parallel with the first VCO;
the second charge pump, the second loop filter, and the third VCO are in parallel with the first charge pump, the first loop filter, and the first VCO; and
the second charge pump, the second loop filter, and the third VCO are in parallel with the first charge pump, the first loop filter, and the second VCO.

15. The portable transmitter of claim 14 wherein:
the first loop filter has a first bandwidth; and
the second loop filter has a second bandwidth smaller than the first bandwidth.

16. The portable transmitter of claim 14 wherein:
the baseband digital modulation stage comprises:
  a digital filter;
  a phase equalizer coupled to the digital filter;
  a digital-to-analog converter coupled to the phase equalizer; and
  an attenuator coupled to the digital-to-analog converter.

17. The portable transmitter of claim 16 wherein:
the digital filter is coupled to the microcontroller;
the phase equalizer is coupled to the accumulator; and
the attenuator is coupled to the first loop filter.

18. The portable transmitter of claim 16 wherein:
the baseband I/Q modulation stage comprises:
  a data interface;
  a data register coupled to the data interface;
  a first interpolating comb filter coupled to the data register;
  a second interpolating comb filter coupled to the data register;
  a first digital-to-analog converter coupled to the first interpolating comb filter;
  a second digital-to-analog converter coupled to the second interpolating comb filter;
  a first filter coupled to the first digital-to-analog converter;
  a second filter coupled to the second digital-to-analog converter;
  a buffer coupled to the second filter;
  a TX up-converter coupled to the first and second filters; and
  an TX offset PLL coupled to the buffer and the TX up-converter.

19. The portable transmitter of claim 18 wherein:
the third VCO is coupled to the TX up-converter; and
the data interface is coupled to the microcontroller.

20. A method of operating a transmitter comprising:
transmitting a first signal from a fractional N synthesizer and a baseband digital modulation stage in the transmitter to modulate the first signal according to a first wireless protocol; and
transmitting a second signal from a baseband I/Q modulation stage and the fractional N synthesizer in the transmitter to modulate the second signal according to a second wireless protocol.

21. The method of claim 20 further comprising:
transmitting a third signal from the baseband I/Q modulation stage and the fractional N synthesizer in the transmitter to modulate the fourth signal according to a third wireless protocol.

22. The method of claim 20 further comprising:
transmitting a third signal from the fractional N synthesizer and the baseband digital modulation stage in the transmitter to modulate the third signal according to a third wireless protocol.

23. The method of claim 22 further comprising:
transmitting a fourth signal from the baseband I/Q modulation stage and the fractional N synthesizer in the transmitter to modulate the fourth signal according to a fourth wireless protocol.

24. The method of claim 23 further comprising:
transmitting a fifth signal from the transmitter using a fifth wireless protocol.

25. The method of claim 24 further comprising:
transmitting a sixth signal from the transmitter using a sixth wireless protocol.

26. The method of claim 20 wherein:
the first wireless protocol is selected from a group consisting of a GSM wireless protocol and a DCS wireless protocol; and
the second wireless protocol is selected from the group consisting of a TDMA wireless protocol, an IDEN wireless protocol, and an AMPS wireless protocol.

* * * * *